United States Patent [19]

Cheung et al.

[11] Patent Number: 5,225,772
[45] Date of Patent: Jul. 6, 1993

[54] AUTOMATIC TEST EQUIPMENT SYSTEM USING PIN SLICE ARCHITECTURE

[75] Inventors: David K. Cheung, Milpitas; Egbert Graeve, Los Altos, both of Calif.

[73] Assignee: Schlumberger Technologies, Inc., San Jose, Calif.

[21] Appl. No.: 577,987

[22] Filed: Sep. 5, 1990

[51] Int. Cl.$^5$ .......................................... G01R 31/28
[52] U.S. Cl. .............................. 324/158 R; 324/73.1; 371/15.1; 371/22.3
[58] Field of Search .......................... 324/158 R, 73.1; 371/15.1, 25.1, 27

[56] References Cited

U.S. PATENT DOCUMENTS

| | | | |
|---|---|---|---|
| 4,594,544 | 6/1986 | Necoechea | 328/97 |
| 4,639,919 | 1/1987 | Chang et al. | 371/27 |
| 4,642,561 | 2/1987 | Groves et al. | 371/25.1 |
| 4,646,299 | 2/1987 | Schinabeck et al. | 371/20 |
| 4,660,197 | 4/1987 | Wrinn et al. | 371/1 |
| 4,682,330 | 7/1987 | Millham | 371/27 |
| 4,724,379 | 2/1988 | Hoffman | 371/20 |
| 4,727,312 | 2/1988 | Fulks | 371/27 |
| 4,746,855 | 5/1988 | Wrinn | 371/20 |
| 4,779,221 | 10/1988 | Magliocco et al. | 364/900 |
| 4,792,932 | 12/1988 | Bowhers et al. | 324/78 F |
| 4,806,852 | 2/1989 | Swan et al. | 324/73.1 |
| 4,809,221 | 2/1989 | Magliocco et al. | 377/48 |
| 4,816,750 | 3/1989 | Van der Kloot et al. | 371/20 |
| 4,857,833 | 8/1989 | Gonzalez et al. | 364/482 |
| 4,875,210 | 10/1989 | Russo et al. | 371/27 |
| 4,928,278 | 5/1990 | Otsuji et al. | 371/27 |
| 4,931,723 | 6/1990 | Jeffrey et al. | 324/73.1 |

OTHER PUBLICATIONS

"Teradyne's Tester For Tomorrow's VLSI", *Electronics* Nov. 13, 1986.
"'Ultimate': A 500-MHz VLSI Test System with High Timing Accuracy", Tsuneta Sudo et al., NTT Electrical Communications Laboratories, Japan, Paper 8.2 1987 International Test Conference, 1987 *IEEE.*
"The Development Of A Tester-Per-Pin VLSI Test System Architecture", Steve Bisset, Megatest Corporation, Santa Clara, Calif., 1983 International Test Conference, Paper 6.2, 1963 *IEEE.*

Primary Examiner—Vinh Nguyen
Attorney, Agent, or Firm—Townsend and Townsend Khourie and Crew

[57] ABSTRACT

A plurality of "pin slice" circuits, each associated with a separate pin of the device under test (DUT). Each pin slice circuit contains its own memory and registers and circuitry for generating the necessary test signals. Test data is loaded into the individual pin slice circuits in a vertical word fashion, such that all of the bits of the vertical word correspond to the individual pin, allowing the characteristics of an individual pin test sequence to be varied independently of the other pins. A participate memory is used to select different groupings of the pin slice circuits which are to be programmed in parallel when a group of pins are to receive the same test signals. Separate enable signals to the various stages of the pin slice circuits allow different aspects of the test pattern to be also varied independently.

8 Claims, 9 Drawing Sheets

AUTOMATIC TEST EQUIPMENT SYSTEM USING PIN SLICE ARCHITECTURE

BACKGROUND OF THE INVENTION

This invention relates to automatic test systems for testing multiple pin electronic components.

In automatic test equipment for the testing of integrated circuits, pin electronics interface circuits are coupled to the pins or other nodes of an electronic device being tested. Through the pins, stimuli signals are supplied to the device under test, and output signals from the device under test are detected and measured. Usually, the stimuli signals represent logic states or analog voltages or currents which are desired to be impressed on the pins of the device under test as a parallel pattern, with the resulting output signals checked in parallel.

Interface circuits of the test equipment function as an interface between the computer controlling the test system and the individual pins of the device under test. The interface circuits receive reference voltages and digital data from other circuits in the test system, and then through drivers associated with each interface circuit switch these voltages or data onto desired input pins of the device under test under control of a program stored in the test system computer. Correspondingly, the interface circuits receive voltages or data from output pins of the device under test and supply that data to a comparator circuit which compares the signal received with the proper response stored in the program of the test system computer.

Memories and registers are used to store the various information needed to provide a test pattern to multiple pins. For instance, the data itself to be provided to the pin is stored as well as the timing information for that data, i.e., the pulse width and beginning and end of pulse times. Typically, a number of data words are stored in a memory or reister with each bit of that word corresponding to a different pin. A large number of such words are required in order to generate a sophisticated test pattern. The bits for a particular pin will vary since different pins will have different functions, i.e., some pins will be input pins, others will be output pins, and others will be control pins, etc. If the pattern for an individual pin needs to be varied for some reason (such as for an upgraded version of an integrated circuit having different pin locations, different pin locations between a die and an encapsulated chip, etc.) then the memory and registers need to be written over for the entire group of pins since each bit applied to the pin to be changed is but one bit of a word which applies to all of the pins.

. SUMMARY OF THE INVENTION

The present invention provides a plurality of "pin slice" circuits, each associated with a separate pin of the device under test (DUT). Each pin slice circuit contains its own memory and registers and circuitry for generating the necessary test signals. Test data is loaded into the individual pin slice circuits in a vertical word fashion, such that all of the bits of the vertical word correspond to the individual pin, allowing the characteristics of an individual pin test sequence to be varied independently of the other pins. A participate memory is used to select different groupings of the pin slice circuits which are to be programmed in parallel when a group of pins are to receive the same test signals. Separate enable signals to the various stages of the pin slice circuits allow different aspects of the test pattern to be also varied independently.

For example, a grouping of a dozen I/0 pins may be given the same test data pattern, but half of the pins may be TTL input while the other half are ECL inputs. Thus, one grouping from the participate memory is used to program the data pattern in parallel to the dozen inputs, while two separate groupings are used to program the voltage levels for digital zeros and ones separately for the TTL inputs and the ECL inputs.

In one embodiment, each pin slice circuit contains a local memory for storing the data pattern to be applied to the pin. The local memory is one RAM with a large number of addresses to provide the vertical word with one bit at each address. The output of local memory for each pin slice circuit is coupled to a FIFO register in order to provide smooth timing output since the local memory RAM must be periodically refreshed, which may interfere with the timing of the test pattern. The structure of the local data stream smoothing is described in detail in U.S. copending application Ser. No. 410,767 filed Sept. 21, 1989, now abandoned.

The output of the FIFO is applied to a sequencer circuit which provides the timing (i.e., location of pulse edges) for the test pattern. A sequencer memory stores various possible edge positions for the timing. The output of the sequencer is coupled to pin electronics which provide the actual voltage levels and currents appropriate for the particular pin. Again, memory is provided to store different possible voltage or current levels which can be selected.

The various memories of the pin slice circuit (local memory, sequencer memory and pin electronics memory) can be written to in parallel for a group of pin slice circuits, or can be written to individually. The participate memory determines which groupings are to be used in parallel.

A separate scrambler RAM is positioned in front of the sequence memory to essentially provide an address translation to select a desired timing criteria in the sequencer memory. This is used when different timing is required for different pins, and thus the scrambler RAMs are individually programmed so that a single address is provided to all the scrambler RAMs in parallel, each one may select a different timing criteria in its associated sequencer memory.

The present invention provides several advantages. The pin slice circuitry is generic, so that it is identical for each pin, thus substantially reducing manufacturing costs. The structure allows the test pattern for individual pins to be varied without affecting a test pattern already programmed for the other pins. As a part of this, it allows the location of the pins to be varied. This is especially useful where a die is tested, and then is retested after being encapsulated in a plastic or ceramic container. The pin locations for the same functional pin may connect to different connectors of the test system in the two versions. The present invention allows adjustment of the pin values by rewriting only selected pins or by reloading the same program but varying the pin assignments through the participate memory.

BRIEF OF THE DRAWINGS

DETAILED DESCRIPTION OF THE PREFERRED EMBODIMENT

Figure 1:
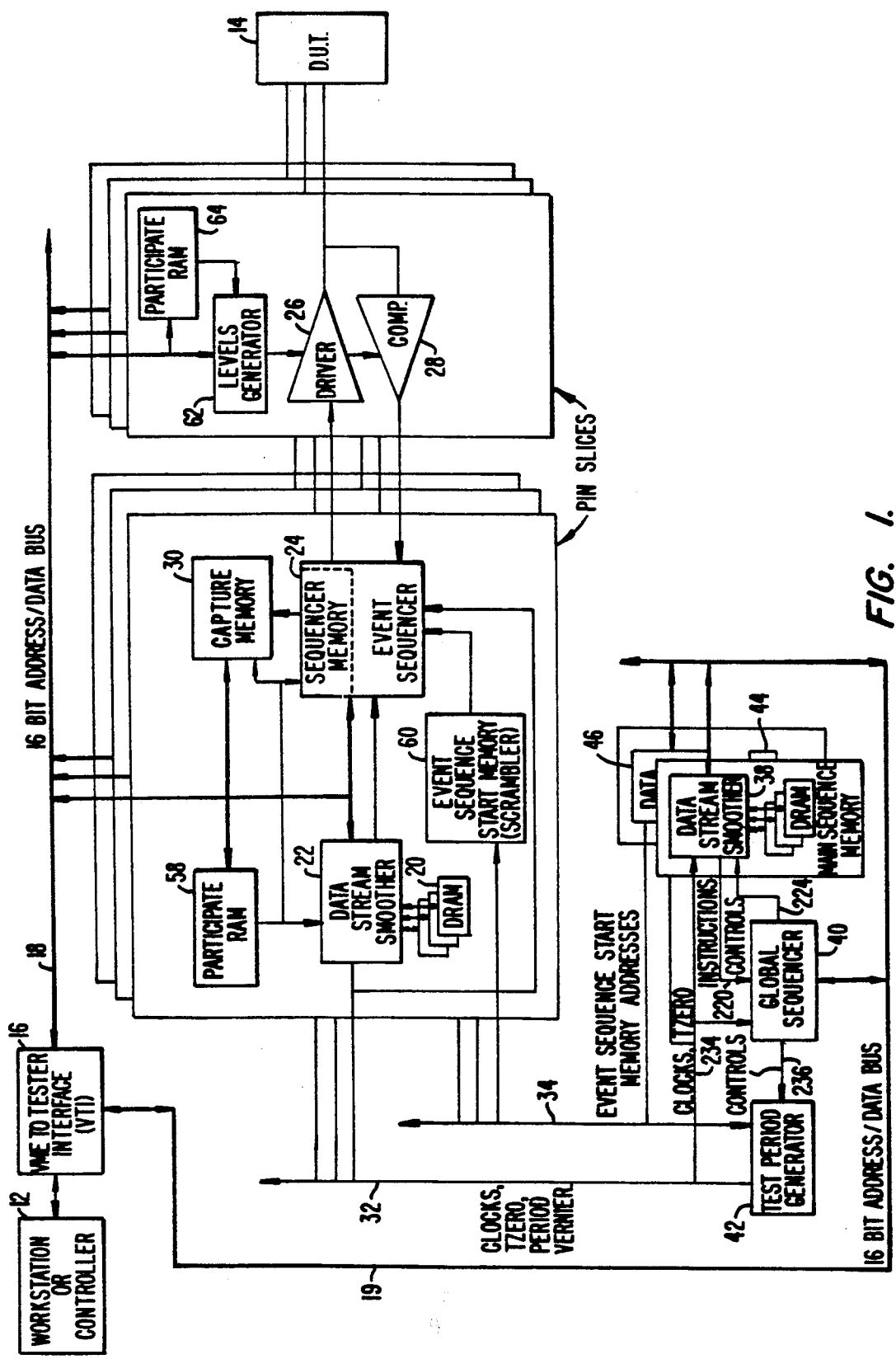
FIG. 1 is a block diagram of the tester of the present invention.

FIG. 1 is a diagram of the tester according to the present invention showing the circuitry between a workstation or controller 12 running the test program and the device under test 14. The tester includes a global sequencer and a number of "pin slices". One pin slice is illustrated, with two more being shown in outline. Preferably, the system would have a large number of pin slices, one for each pin of the device under test. In one embodiment, 512 pin slices are used.

The data from the test program is loaded from workstation 12 through a VME to tester interface (VTI) 16 to a 16 bit address/data bus 18. Address/data bus 18 is coupled to the global sequencer and each of the pin slices. The data indicating what signals are to be applied to a particular pin are stored in a set of local DRAMs 20. This data is passed through a data stream smoother 22, which could be a FIFO register. The data is passed to an event sequencer 24 which generates the necessary timing and provides the signal through a driver 26 to the device under test (DUT) 14. When outputs of the pin on DUT 14 are to be measured, they are provided through a comparator 28 which compares them to an expected result and passes this on through event sequencer 24 to a capture memory 30.

The global sequencer provides clocks on lines 32 to not only clock out the data from local memory 20, but also to sequence event sequencer 24. In addition, addresses are provided on lines 34 to select the appropriate stored sequence in event sequencer 24. The clocking information is stored ahead of an actual test in global sequencer DRAM memory 36. During a test, this data is provided through a data stream smoother 38 as instructions to a global sequencer 40. Global sequencer 40 controls the test period generator 42 which generates the actual clock signals.

At the same time, a separate DRAM memory 44 stores address information which is provided through a data stream smoother 46 to address lines 34.

Local memory DRAM 20 stores the data pattern to be applied to the pin it is associated with. The local memory is a set of several DRAMs with a large number of addresses providing a vertical word with one bit at each address. This vertical word structure is demonstrated in FIG. 2.

Figure 2:
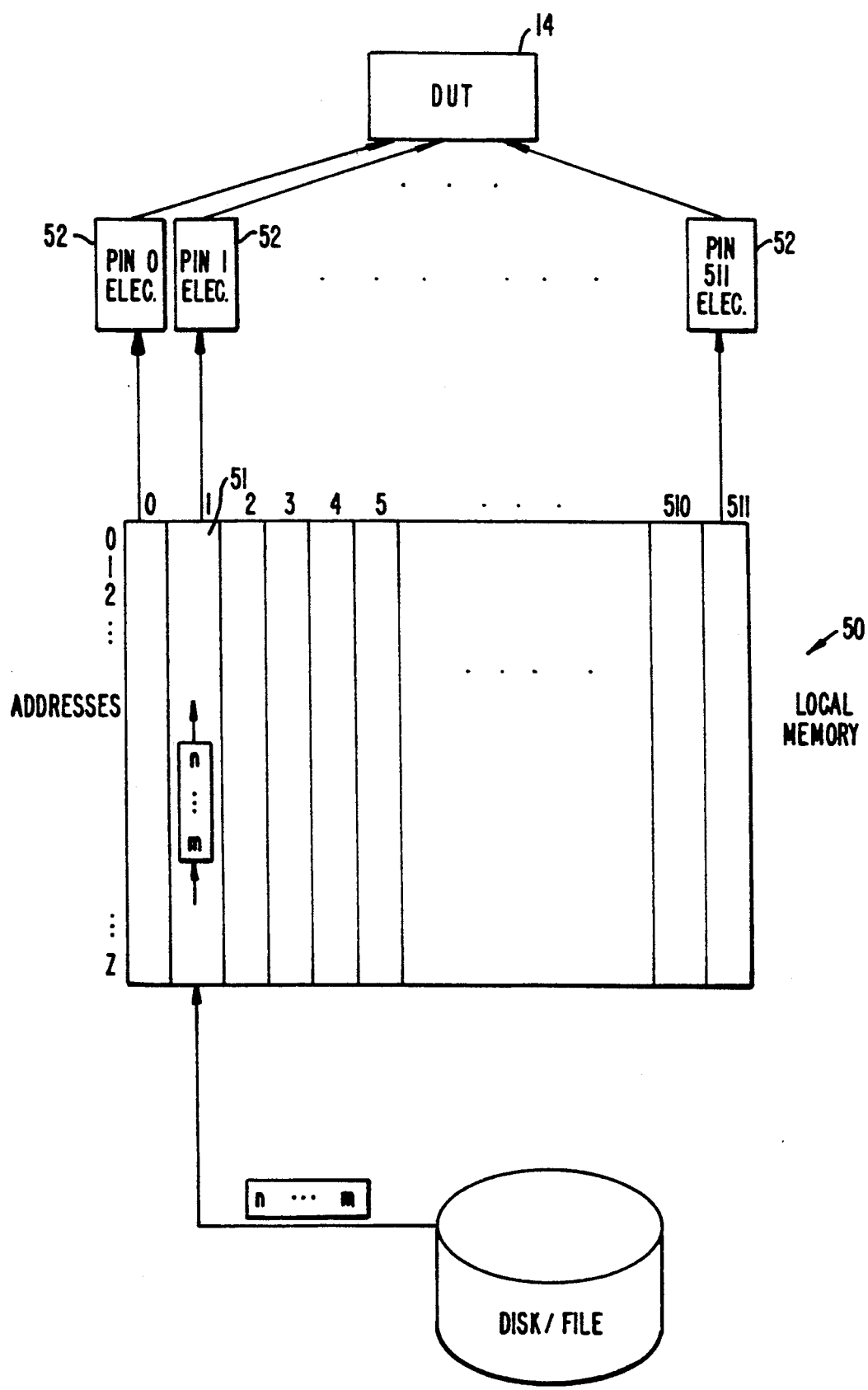
FIG. 2 is a diagram illustrating the vertical word structure of the local memory of FIG. 1.

FIG. 2 shows a local memory 50 with 512 positions (0-511), each associated with one pin of DUT 14. Each of the 512 outputs, corresponding to a separate set of DRAM chips, is applied to a different pin through pin electronics blocks 52. For an individual pin, such as pin 1, if a data pattern word represented as N . . . M bits is to be applied to the pin, it is loaded into the single set of DRAMs 51 connected to pin 1 and indicated as column 1 in local memory 50 in FIG. 2. The N bit is at address zero in column 1, the next bit is at address 1 in column 1, etc., with the last bit M being at, i.e., address 31 in column 1. This is contrary to the standard architecture in which the word would be at address zero, with the N bit being at column zero and the M bit being at column 31, corresponding to the 32nd DRAM chip. In such a normal configuration of data in memory, the 32 bits of a word are spread out across 32 DRAM chips, and are applied to 32 pins with a single bit stored in each chip. In the present invention, on the other hand, a single chip contains the entire word which contains 32 bits which are applied sequentially to the pin.

Figure 3A:
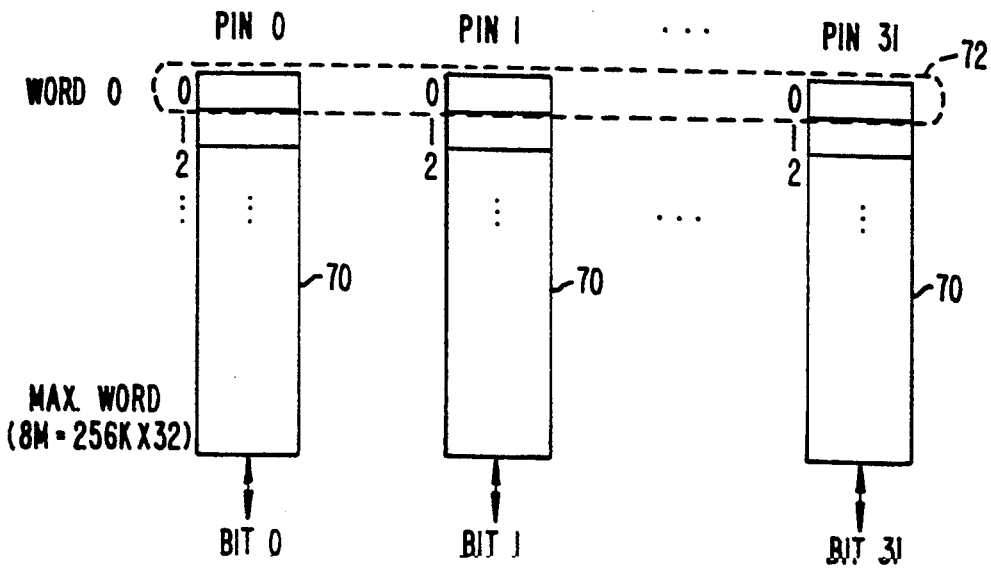
FIG. 3a is a diagram of the prior art method of providing bits to the pin.

FIG. 3A illustrates the prior art method of providing bits to the pins. Each pin has a memory 70 associated with it. When words are loaded in the memories, they are loaded as 32 bit words across 32 of the memories 70 as indicated, for example, by word zero which is shown by dotted lines 72. The bits of the word are indicated at the bottom of the figure as bits 0-31, spread across the memories 70.

Figure 3B:
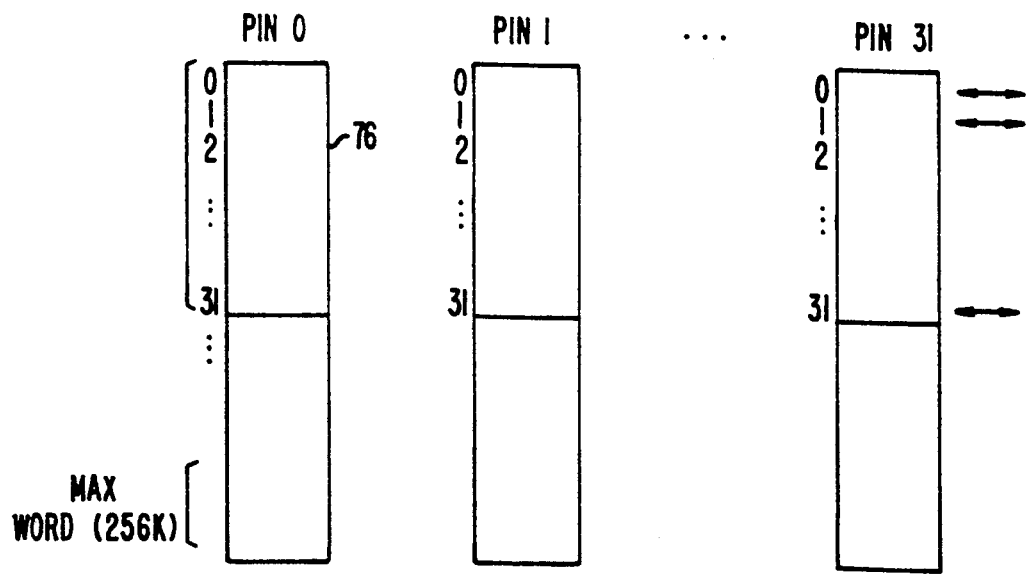
FIG. 3b is a diagram of the method of the present providing bits to the pins.

In the present invention, on the other hand, as shown in FIG. 3B, a word zero, indicated by bracket 74 is loaded entirely into a first memory 76 for pin 0. The bits themselves are arranged vertically in this memory. Thus, in the present invention, all of the bits of each word correspond to a single pin. In the prior art shown in FIG. 3A, the bits of a word each correspond to a separate pin. In each architecture, each pin has $256K \times 32 = 8M$ bits of local memory. The difference is the way in which the memory is organized and written into.

Returning to FIG. 1, the output of DRAM 20 is applied to data stream smoother 22 which could be a FIFO register. The data stream smoother is used to provide smooth timing outputs since the DRAM must be periodically refreshed, which may interfere with the timing of the test pattern.

The output of data stream smoother 22 is applied to event sequencer 24, which provides the timing (i.e., location of pulse edges) for the test pattern. The event sequencer includes memory for storing the various possible edge positions for the timing. The structure of the event sequencer 24 is shown in more detail in copending application Ser. No. 07/577,986, filed Sept. 5, 1990, entitled "Event Sequencer For Automatic Test Equipment", filed concurrently herewith and herein incorporated by reference.

Figure 4:
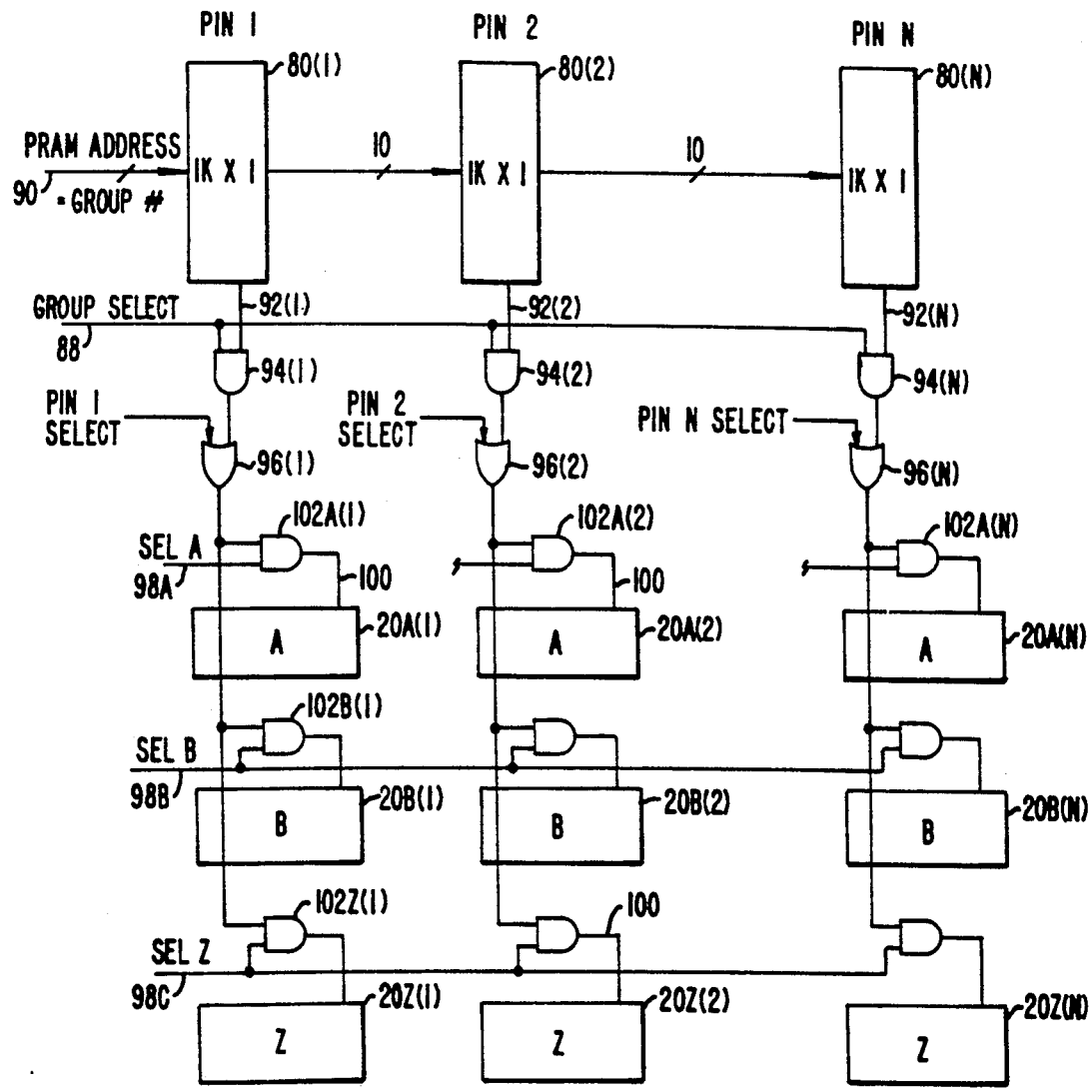
FIG. 4 is a diagram illustrating the participate RAM organization of the present invention.

A unique participate RAM 58 is used to aid in the loading of patterns in DRAM 20. For example, there may be three different types of pins on the DUT which require three different types of signals. All of the local memories for each pin slice cannot be loaded in parallel, since they require three separate types of data. Loading the local memories individually, however, would require a large amount of time. This is solved by using participate pate RAM 58, which is loaded first to indicate whether a particular pin slice is part of groups one, two or three. Thereafter, the data can simply be provided with an indication that it is for group one, and if this matches the group in participate RAM 58, the data is allowed to be loaded into DRAM 20. Thus, for example, if there are 20 pins in group one, they can all be loaded in parallel. Participate RAM 58 can be loaded with a number of different groupings ahead of time. The participate RAM uses the same principle as the participate register shown in U.S. Pat. No. 4,594,544. The modifications necessary to operate a RAM instead of a register are shown in FIG. 4, described below.

Any event sequencer start memory 60 is coupled between address lines 34 and event sequencer 24. This memory is used as a scrambler RAM to provide address translation to select a desired timing criteria in the sequencer memory of event sequencer 24. The scrambler memory 60 allows the pre-programming of different combinations of timing for different pins. A single address provided to all of these scrambler RAMS 60 in parallel will then be able to select different timing criteria combinations for each of the pin slices.

Associated with driver 26 is a levels generator 62 for generating the particular voltage and current levels to be applied to DUT 14. These levels may vary from pin to pin, and have to be loaded ahead of the actual test. Again, a participate RAM 64 is used to allow groupings of levels and thus simplify the programming operation.

Capture memory 30 has one location which is used to indicate if there are any failures for a particular test pattern. If any failure is detected during a test pattern, that location is toggled. Thus, after the test, capture memory 30 would normally have to have all those locations read to indicate when there has been a failure. However, if the designated location has not been toggled, this means that every test has passed and there is no need to read the rest of capture memory 30.

FIG. 4 is a diagram illustrating the participate RAM organization. A number of participate RAMs 80(1), 80(2) and 80(N) are shown. Each of these participate RAMs is in circuitry corresponding to pins 1, 2 and N, respectively. These participate RAMs are used to determine whether particular test data for that pin is to be written into one of its memories 20A ... Z(1), 20A ... Z(2) and 20A ... Z(N). These memories correspond to DRAMs 20 of FIG. 1.

RAMs 80 are first written at a number of addresses. Each address corresponds to a particular grouping of pins. For example, address 2 would correspond to grouping 2 which may include all the data input pins of the DUT. Thus, participate RAMs 80 corresponding to the data input pins would have a 1 put in at address 2, while the remaining participate RAMs would have a 0 put in at address 2. Subsequently, when desiring to write data for group 2 into the DRAMs 20, the group select signal is applied on a line 88 and the address for the desired group is provided on address bus 90 to the participate RAMs. If the participate RAM for that pin is a part of that group, it will have a 1 bit stored at the location, which will be output on an output line 92 to an AND gate 94. If the group select is ON and the pin is a member of that group, the output of AND gate 94 will be passed through an OR gate 96 to an appropriate one of memory chips 20. The particular memory chip 20 is chosen by a select signal on one of select signal lines 98. The enabled select line will allow the bit to pass through to an enable input 100 of the DRAM through an AND gate 102. Both reading and writing to the memory 20 is done in the same way. Note that the elements in the drawing corresponding to a particular pin are labeled with that pin number in parentheses. The additional letters for the circuitry indicates which row of DRAM in DRAMs 20 the circuitry is associated with.

Figure 5:
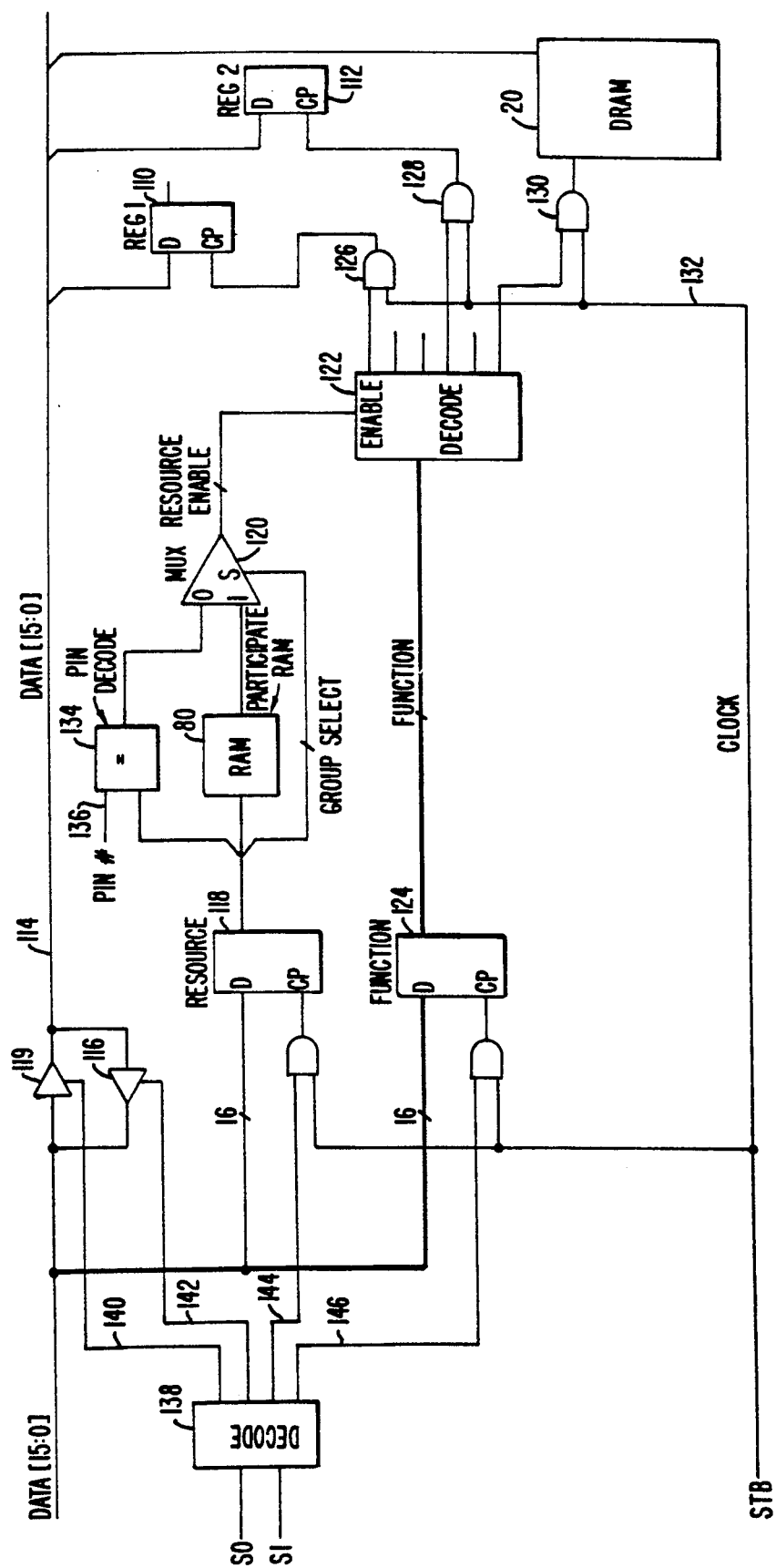
FIG. 5 is a diagram of the participate RAM circuitry for one pin slice.

FIG. 5 shows the circuitry for the participate RAM 80 for one pin slice. Participate RAM 80 can not only indicate when its associated DRAM 20 is to be written to or read from as part of a group, but also whether other registers in the pin slice circuitry, such as registers in the levels generator, etc., should be written to or read from. These other registers are illustrated by registers 110 and 112 in FIG. 5. Each of the registers and the DRAM 20 are connected to a data bus 114, with a read path being provided by buffer 116 and a write path by buffer 119.

When writing to the participate RAM or indicating a particular group, the data for that group is provided from the data bus through latches 118. After participate RAM 118 is written to, a group select signal can be provided through latches 118 to the appropriate address in RAM 80 and also to the select input of a multiplexer 120. Multiplexer 120 will then select the output of participate RAM 80 to provide it to an enable input of a decoder 122. Decoder 122 will decode a function which is subsequently provided through function latches 124. The function will indicate which of the registers 110, 112 or DRAM 20 should be written to, or may designate other registers throughout the particular pin slice. This is done by signals which enable AND gates 126, 128 and 130 which have as their other input a clock signal on a line 132.

If an individual pin is to be written to, this is indicated by data provided through resource latches 118 to a comparator 134. The other input 136 of the comparator would have been previously programmed via a register to indicate the pin number associated with this pin slice circuitry. If there is a match, an enable is provided through multiplexer 120, with this input being selected by the absence of the group select signal on the select input. Please note that the lower level decoding circuitry for the group select to provide it to the multiplexer input and other lower level circuitry is not shown for the sake of understanding. Implementation of such circuitry would be obvious to one who is skilled in the art.

A decoder 138 receives two control signals S0 and S1 and provides four decoded outputs. Output line 140 selects a write operation, output 142 a read operation, output 144 the provision of resource data and output 146 the provision of function data.

Figure 6:
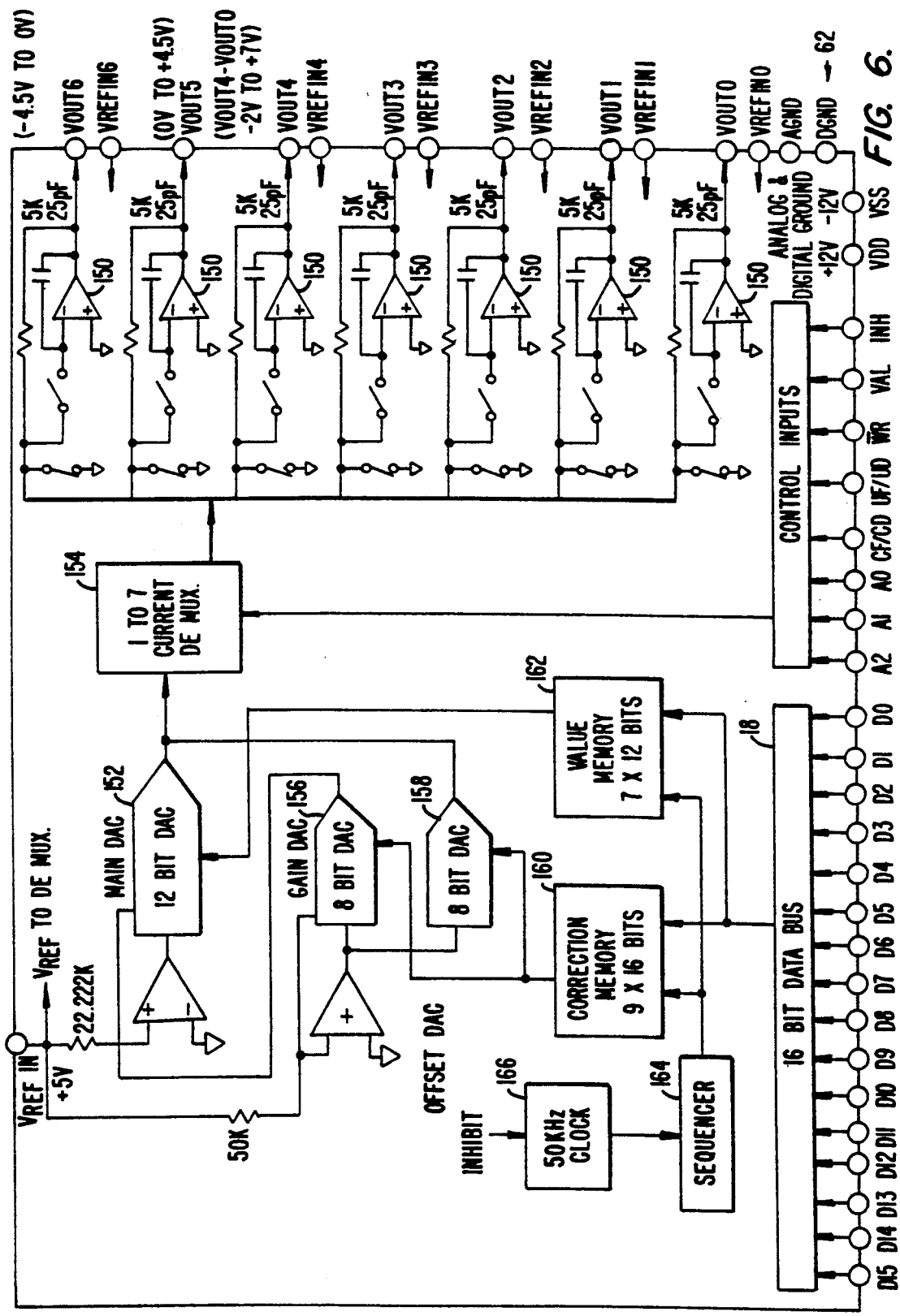
FIG. 6 is a diagram of levels generator 62 of FIG. 1.

FIG. 6 is a more detailed diagram of the levels generator 62 of FIG. 1. Seven different output voltages are provided by seven amplifier circuits 150. Each circuit includes a capacitor for storing charge to maintain the voltage level. Of the seven voltage levels, two are used for the high and low input levels to be applied to a pin, two are used as the high and low comparison levels for output from a pin and three are used for providing a programmable load.

All of amplifier circuits 150 have their capacitors recharged through a digital to analog converter (DAC) 152. A multiplexer 154 connects the appropriate one the amplifier to charge it at a particular point in time. The gain of DAC 152 is set with a DAC 156, while its offset is set with DAC 158. A memory 160 stores a correction value for DACs 156 and 158, while a memory 162 stores the value for DAC 152. These memories receive their data input from the data bus 18. The sequencing is provided by sequencer 164 which runs off of a clock 166.

Figure 7:
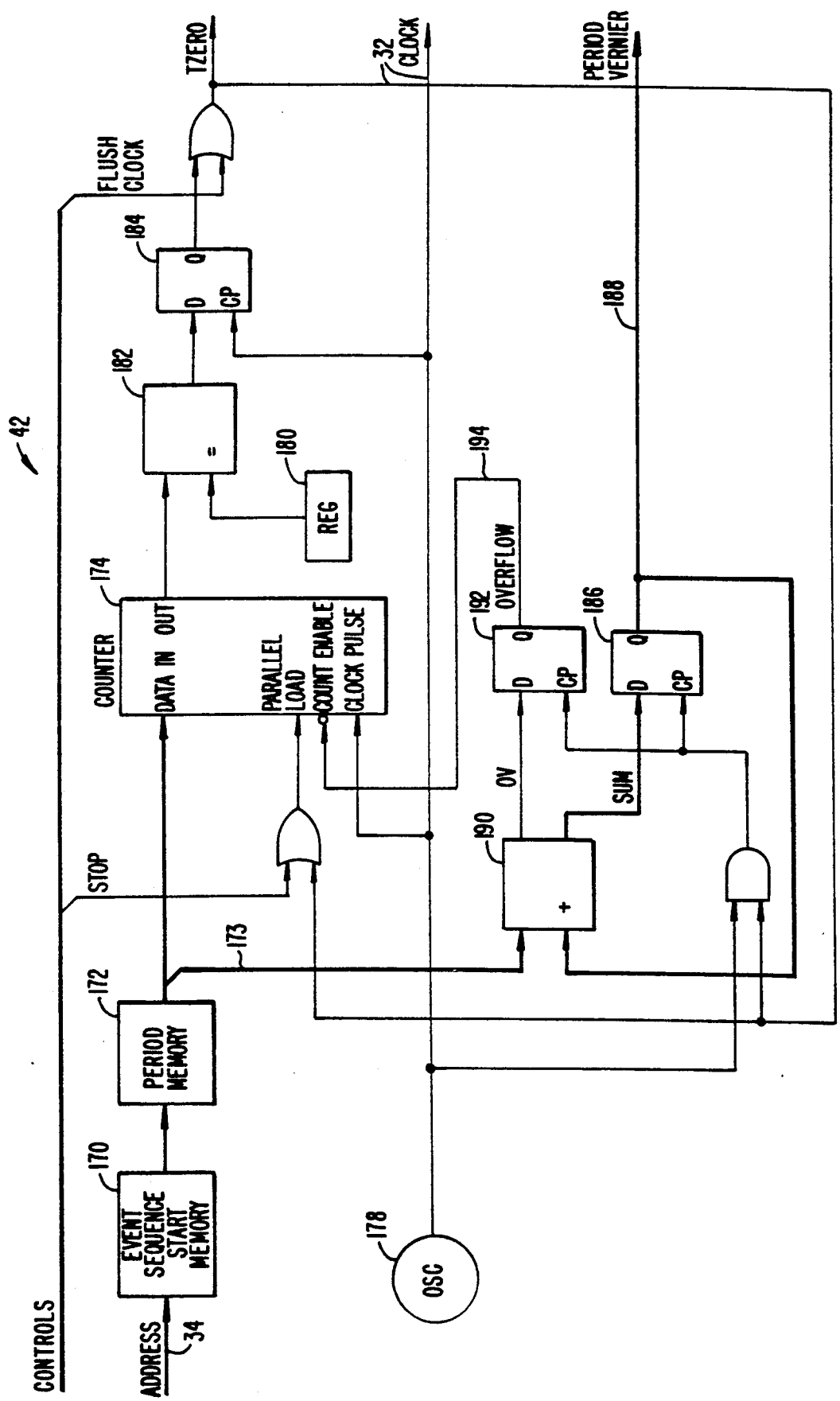
FIG. 7 is a diagram of test period generator 42 of FIG. 1.

FIG. 7 is a diagram of test period generator 42 of FIG. 1. The address is on bus 34 is provided to an SRAM 170. The output of SRAM 170 is provided to another memory 172 to provide a level of isolation for ease of programming. The output of memory 172 is provided as a data input to a counter 174, which is sequenced by a clock on a clock line 176 from an oscillator 178. When the output of counter 174 reaches a predetermined value stored in register 180, an output will be provided from a comparator 182. The output of comparator 182 is provided through a latch 184 to provide a time zero signal, indicating the start of a test event. This time zero signal will be periodically generated from counter 174.

The global period offset, or period vernier, which is referenced from the time zero is generated by a latch 186 on period vernier lines 188. The original offset value is provided from memory 172 on lines 173 through adder 190 to latch 186. The output 188 is fed back to an adder 190, where it is summed with the original bits from memory 172 to produce sum and overflow values. The sum value is provided back to latch 186 to provide the next period vernier offset (after the next time zero signal), while the overflow value is provided through a latch 192 to give an overflow output on a line 194 which is provided as an input to counter 174. This adds a clock cycle increment to the counter when the amount of the offset equals a clock cycle. The timing generated by this circuit is discussed in more detail in copending U.S. application Ser. No. 07/577,986, filed Sept. 5, 1990, entitled "Event Sequencer for Automatic Test Equipment".

Figure 8:
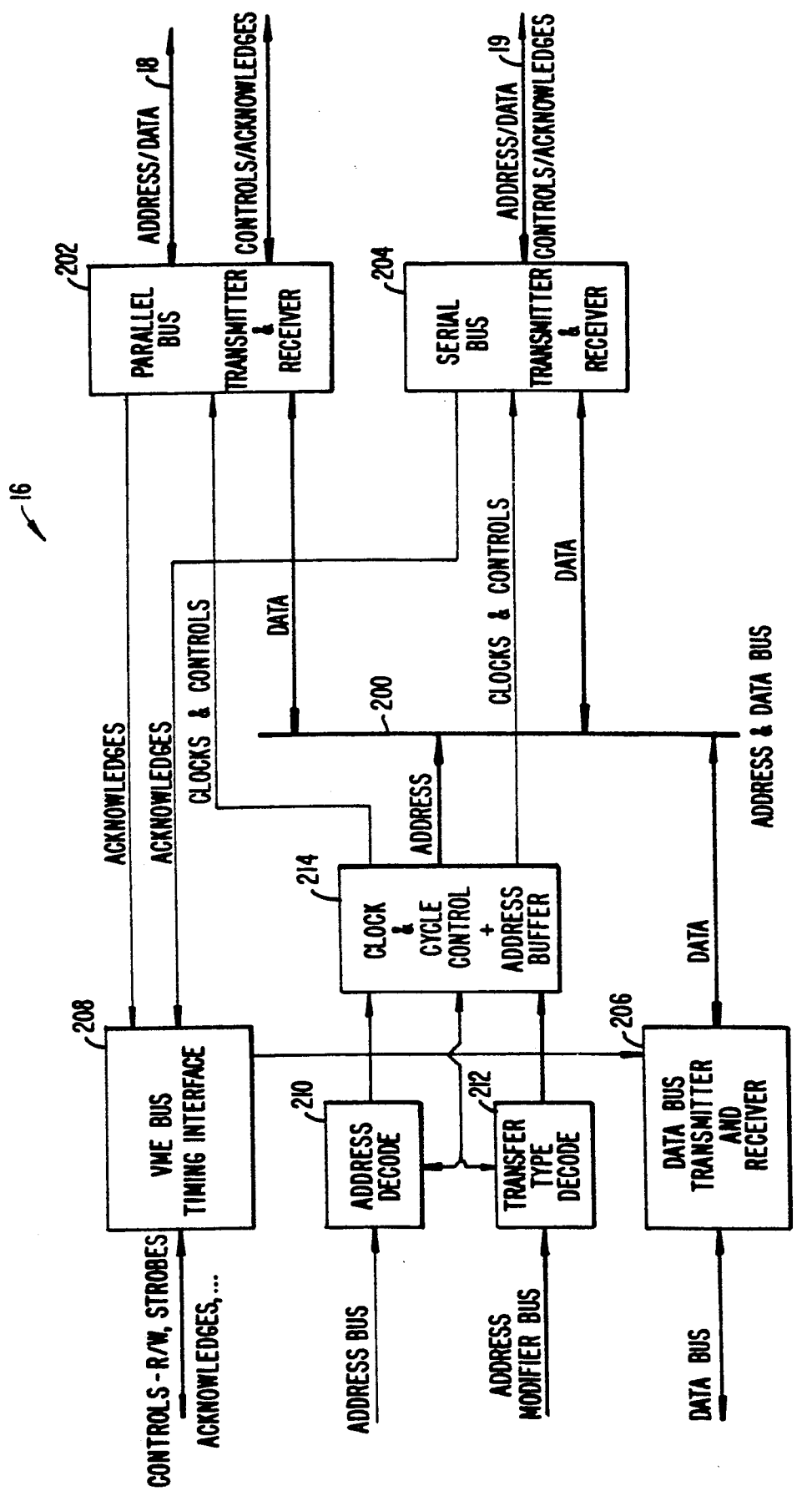
FIG. 8 is a diagram of VME to tester interface 16 of FIG. 1.

FIG. 8 is a diagram of VME to tester interface (VTI) 16 of FIG. 1. On the left side of the figure are the address, data, and control signals from work station 12 of FIG. 1. On the right side are buses 18 and 19 of FIG. 1. An internal address and data bus 200 is used. A parallel bus transmitter and receiver 202 couples bus 200 to bus 18. A serial bus transmitter and receiver 204 couples bus 200 to bus 19. On the other side a data bus transmitter and receiver circuit 206 interfaces with work station 12. Also provided are a VME bus timing interface 208, an address decode circuit 210, a transfer type decode circuit 212 and a clock and control cycle and address buffer 214.

Figure 9:
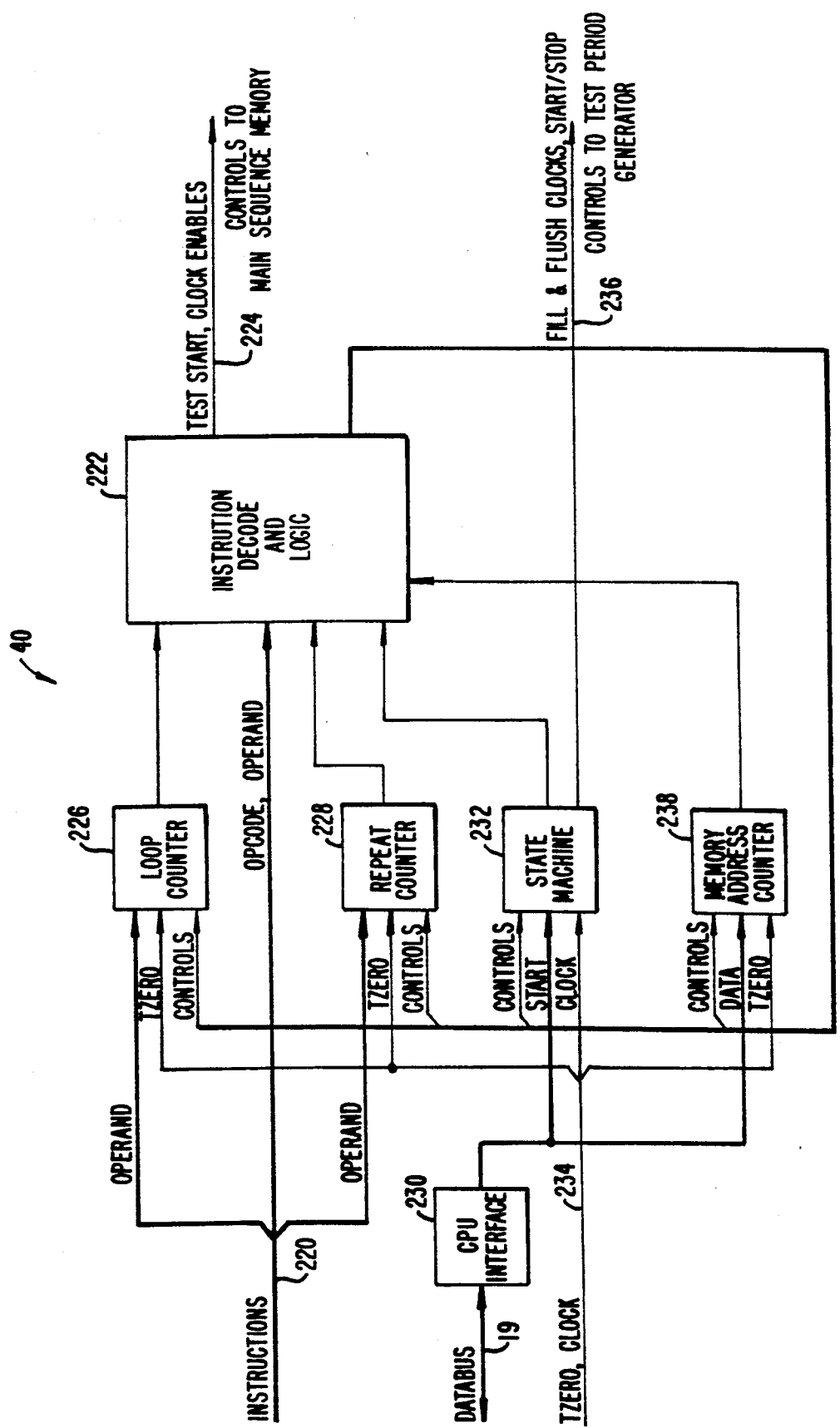
FIG. 9 is a diagram of global sequencer 40 of FIG. 1.

FIG. 9 shows the global sequencer 40 of FIG. 1. Instructions are provided on a bus 220 from the main sequence memory shown in FIG. 1. This is coupled directly to instruction decode logic 222 which produces the start and clock enable signals on lines 224. Instructions are also provided to a loop counter 226 and a repeat counter 228. A CPU interface 230 receives data on bus 19 from work station 12 through VTI 16. A state machine 232 receives the clock and time zero signals from the main sequence memory on lines 234, and provides control signals 236 to test period generator 42. Finally, a memory address counter 238 is provided.

The global sequencer is responsible for sequencing the provision of data to a test system. At certain cycles, the equipment for certain pins will be stimulated according to memory address counter 238. State machine 232 contains the instructions for flushing the pipeline and issuing original clock signals for the start of a sequence. Repeat counter 238 allows the vector for a certain cycle to be repeated. Loop counter 226 allows a sequence of cycles to be repeated.

As will be understood by those familiar with the art, the present invention may be embodied in other specific forms without departing from the spirit or essential characteristics thereof. For example, a participate register could be used instead of the participate RAM, or a standard timing generator rather than the event sequencer of the present invention could be used. Accordingly, the disclosure of the preferred embodiment of the present invention is intended to be illustrative, but not limiting, of the scope of the invention which is set forth in the following claims.

What is claimed is:

1. A tester for multiple pin integrated circuits, comprising:
   (a) a plurality of pin slice circuits, each coupled to a separate pin connector, each pin slice circuit including,
      (1) a local memory having a single bit I/O and a plurality of addresses, for storing a string of data to be applied to said pin connector,
      (2) event sequencing means, coupled to an output of said local memory, for providing timing control of said data and including a sequencer memory for storing a plurality of timing criteria,
      (3) driver means, coupled between said event sequencing means an said pin connector, for driving signals to said pin connector,
      (4) levels generator means, coupled to said driver means, for providing appropriate voltage and current level so said driver means and including a voltage memory for storing voltage and current levels, and
      (5) a participate memory for storing an indication that said pin slice circuit belongs to a combination of said pin slice circuits to be programmed with identical data, having an output coupled to an enabling input of said pin closed circuit;
   such that separate patterns can be written into said local memories, sequencer memories and voltage memories for independent grouping of said pin slice circuits.

2. The tester of claim 1 wherein each said pin slice circuit further includes a scrambler memory having data outputs coupled to address inputs of said sequencer memory, said scrambler memory being programmable so that a single address provided to the scrambler memory for all pin slice circuits can select different addresses in said sequencer memories for different pin slice circuits.

3. The tester of claim 1 wherein each said pin slice circuit further includes means for buffering a data stream coupled to an output of said local memory.

4. The tester of claim 3 wherein said means for buffering a data stream comprises a first-in, fist-out register.

5. The tester of claim 1 wherein each said pin slice circuit further includes
   a comparator, coupled to said pin connector, for evaluating an output of said integrated circuit;
   a capture memory, coupled to said comparator for storing a pass or fail indication for a plurality of tests; and
   a cumulative fail memory location in said capture memory, for storing a fail signal if any location in said capture memory has a fail signal written to it;
   such that said capture memory will contain all pass signals, and thus need not be read, unless said cumulative fail memory location contains a fail signal.

6. A tester for multiple pin integrated circuits, comprising:
   a plurality of pin slice circuits, each coupled to a separate pin connector, each pin slice circuit including,
      (1) a local memory having a single bit I/O and a plurality of addresses, for storing a string of data to be applied to said pin connector, (2) event sequencing means, coupled to an output of said local memory, for providing timing control of said data and including a sequencer memory for storing a plurality of timing criteria, (3) driver means, coupled between said event sequencing means and said pin connector, for driving signals to said pin connector, (4) levels generator means, coupled to said driver means, for providing appropriate voltage and current levels to said driver means and including a voltage memory for storing voltage and current levels, (5) a first participate memory for storing data at addresses which indicate if said local memory is to be used for a grouping of pin slice circuits indicated by said addresses having an output coupled to an enabling input of said local memory, (6) a second participate memory for storing data at addresses which indicate if said voltage memory is to be used for a grouping of pin slice circuits indicated by said addresses having an output coupled to an enabling input of said voltage memory, and (7) a scrambler memory having data outputs coupled to address inputs of said sequencer memory, said scrambler memory being programmable so that a signal address provided to the scrambler memory for all pin slice circuits can select different addresses in said sequencer memories for different pin slice circuits;

such that separate patterns can be written into said local memories, sequencer memories and voltage memories for independent grouping of said pin slice circuits.

7. The tester of claim 6 wherein each said pin slice circuit further includes a first-in, first-out register coupled to an output of said local memory.

8. The tester of claim 6 wherein each said pin slice circuit further includes a comparator, coupled to said pin connector, for evaluating an output of said integrated circuit;

a capture memory, coupled to said comparator for storing a pass or fail indication for a plurality of tests; and a cumulative fail memory location in said capture memory, for storing a fail signal if any location in said capture memory has a fail signal written to it;

such that said capture memory will contain all pass signals, and thus need not be read, unless said cumulative fail memory location contains a fail signal.

* * * * *